United States Patent [19]

Lee et al.

[11] Patent Number: 5,411,899
[45] Date of Patent: May 2, 1995

[54] TRANSISTOR FABRICATION OF A TWIN TUB USING ANGLED IMPLANT

[75] Inventors: Kuo-Hua Lee, Wescosville; Chen-Hua D. Yu, Allentown, both of Pa.

[73] Assignee: AT&T Corp., Murray Hill, N.J.

[21] Appl. No.: 135,708

[22] Filed: Oct. 13, 1993

[51] Int. Cl.⁶ .......................................... H01L 21/266
[52] U.S. Cl. ...................................... 437/34; 437/35; 148/DIG. 70
[58] Field of Search ............... 437/34, 35, 57, 979, 437/985; 148/DIG. 70, DIG. 116, DIG. 163

[56] References Cited

U.S. PATENT DOCUMENTS

| | | | |
|---|---|---|---|
| 4,931,406 | 6/1990 | Tomioka | 437/34 |
| 5,225,365 | 7/1993 | Cosentino | 437/57 |
| 5,296,401 | 3/1994 | Mitsui et al. | 437/57 |
| 5,300,797 | 4/1994 | Bryant et al. | 437/34 |

FOREIGN PATENT DOCUMENTS 1-187923  7/1989  Japan ....................... H01L 21/265

OTHER PUBLICATIONS

Wolf et al., "Silicon Processing for the VLSI Era, vol. 1-Process Technology", pp. 321-323, 1986.
"High Carrier Velocity and Reliability of Quarter-Micron SPI (Self-aligned Pocket Implantation) MOSFETs," Atsushi Hori et al., Semiconductor Research Center, Matsushita Elec. Ind. Co., Osaka, Japan, pp. 28.3.1–28.3.4, IEDM-92.

Primary Examiner—Tom Thomas
Assistant Examiner—Chandra Chaudhari
Attorney, Agent, or Firm—John T. Rehberg

[57] ABSTRACT

A method for forming a twin tub semiconductor integrated circuit is disclosed. A portion of a semiconductor substrate is masked by oxide, nitride and photoresist. P-type dopant is directed towards the other portion of the substrate. Subsequently, the photoresist is removed and a protective oxide is grown over the p-tub, thereby driving the dopant into the substrate. Next, an n-type ion implantation is performed to create the n-tub. The n-type ions are directed at the substrate at an angle which is away from normal incidence. The angular direction of the n-type dopants permits the use of smaller screen oxides over the n-tub and smaller protective oxides over the already-formed p-tub. When all of the protective oxides have been removed, the inventive technique provides a twin tub substrate having a comparatively smooth upper surface.

6 Claims, 1 Drawing Sheet

TRANSISTOR FABRICATION OF A TWIN TUB USING ANGLED IMPLANT

TECHNICAL FIELD

This invention relates to methods of semiconductor integrated circuit fabrication.

BACKGROUND OF THE INVENTION

As the use of integrated circuits becomes evermore commonplace, the popularity of CMOS Integrated Circuits has risen commensurately. Many CMOS Integrated Circuits are formed by creating a p-tub or p-well in a portion of a silicon substrate and creating an n-tub or n-well in the remainder of the silicon substrate. Some popular processes utilize fairly thick oxides to mask one tub (for example the already-formed p-tub) while the other tub (for example, the n-tub) is being formed. After both tubs have been formed, the thick oxide is removed. Unfortunately, the thickness of the oxide creates a height difference between the n-tub and the p-tub. The height difference contributes to an undesirably rough topography in the finished integrated circuits. Furthermore, the height difference also creates depth of focus problems for subsequent lithography steps.

Circuit designers have continually searched for methods to reduce the height difference between the n-tub and p-tub so that the deficiencies mentioned above may be alleviated.

SUMMARY OF THE INVENTION

The height difference problem is addressed by the present invention which illustratively includes: directing a first conductivity-type dopant species normally at a first portion of a substrate; and forming a material layer over the first portion of the substrate. Then, a second conductivity type dopant species is directed at an angle away from normal at a second portion of the substrate. The material layer substantially absorbs the second type dopant. A first conductivity type region is formed in the first portion of the substrate and a second conductivity type region is formed in the second portion of the substrate. Then at least one transistor is formed in the first region and one transistor is formed in the second region.

DETAILED DESCRIPTION

Figure 1:
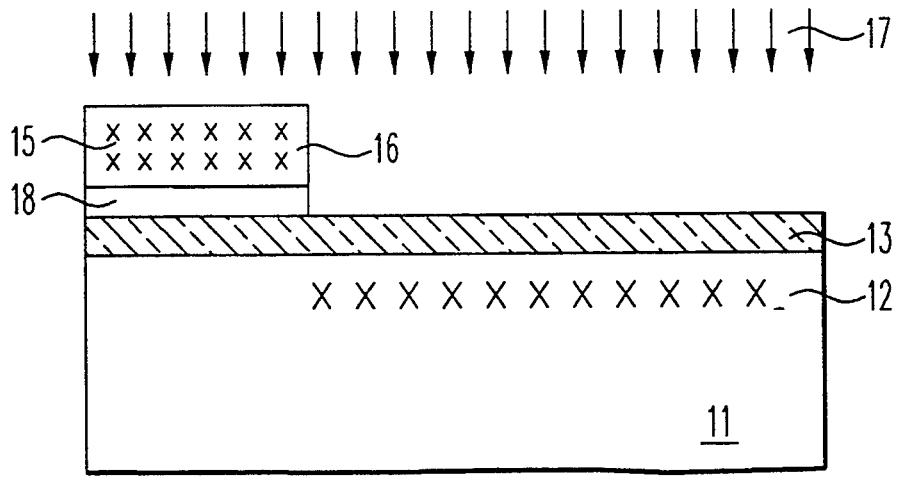
FIGS. 1, 2 and 3 are cross-sectional diagrams schematically illustrating a portion of an integrated circuit and useful in an understanding of an illustrative embodiment of the present invention.

In FIG. 1, reference numeral 11 denotes a substrate which may be, typically, silicon, doped silicon, or epitaxial silicon. In general, the term substrate denotes a body or a material upon which layers may be deposited or formed. Reference numeral 13 denotes an oxide layer, typically having a thickness of approximately 100 Å. Layer 13 may be as thin as 50 Å. (In previously used designs, it was necessary that layer 13 have a thickness of approximately 1000 Å.)

Reference 15 denotes a patterned photoresist material. Reference numeral 18 denotes a layer of silicon nitride which has been patterned with photoresist 15. Reference 17 denotes a p-type dopant species which is directed at substrate 11. Typically, the p-type dopant species may be boron. As can be appreciated from an examination of FIG. 1, p-type dopant species 17 penetrates oxide 13 and embeds itself in substrate 11. Embedded dopant ions are denoted by reference numeral 12. However, photoresist 15 and silicon nitride layer 18 tend to block the dopant ion 17 by absorbing them. Dopant ions absorbed in photoresist 15 are denoted by reference numeral 16.

After the p-type ion implantation step is completed, photoresist 15 is removed.

Figure 2:
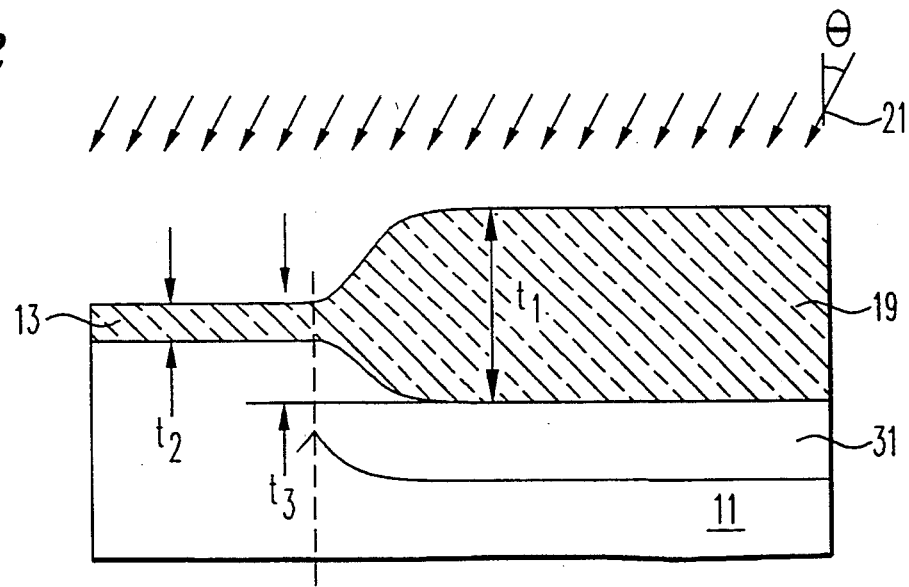

In FIG. 2, photoresist 15 has been removed and oxide 19 has been grown over those areas of substrate 11 which were not covered by nitride layer 18. The oxide growth process tends to diffuse embedded ions 12 into substrate 11, thereby forming a p-tub denoted by reference numeral 31. Illustratively, in the present invention, oxide 19 is grown until it has a total thickness, $t_1$, of approximately 600 Å. (By contrast, in conventional twin tub processing, oxide 19 may be grown to have a thickness of approximately 4000 Å.)

Next, nitride layer 18 is removed. Then, an n-type implant species 21 is directed at the entire wafer. Unlike conventional practice in which the n-type dopant species are directed normally at the surface of substrate 11, in the present invention, n-type implant species are directed at an angle $\theta$, measured away from normal. The n-type implant species tend to be absorbed in thick oxide 19, and they thereby have little effect on the p-tub 31. Typical n-type dopants are phosphorous or arsenic. Phosphorous, for example, may be implanted with a dose of 4.5 E $12/cm^2$ and an energy of 140 Kev. (As mentioned before, approximately 4000 Å of oxide was previously grown over the p-tub to protect it from the 140 Kev implant.) Because the n-type dopant is directed at an angle $\theta$ towards oxide 13 (sometimes termed a screen oxide) oxide 13 appears to be effectively thicker. Consequently, as mentioned before, oxide 13 may have thickness, $t_2$ as low as 50 Å, whereas in previous conventional practice, screen oxide 13 was typically 1000 Å. The n-type dopant species embed themselves in that portion of substrate 11 below screen oxide 13, thereby forming an n-tub 33 (in FIG. 3). The wafer is rotated during the implantation process to prevent shadowing.

Figure 3:
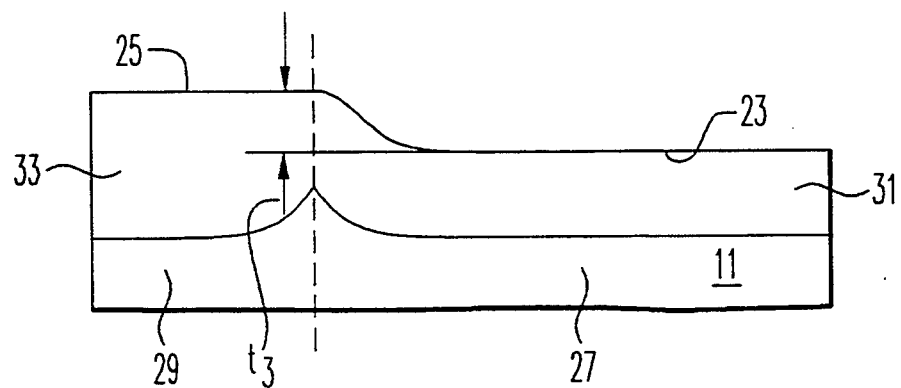

In FIG. 3, oxides 19 and 13 have been removed leaving substrate 11 with p-tub 31 and n-tub 33. Because oxide 19 was made considerably thinner than usual (for example, approximately 600 Å), the height difference between the top surface 23 of p-tub 31, and the top surface 25 of n-tub 33, denoted by $t_3$, is considerably smaller than usual. Typically, in current practice the height difference $t_3$ is equal to 1000–2000 Å, but in the present invention, the height difference may be expected to be approximately 200–500 Å. A tub drive-in may be subsequently performed.

Conventional semiconductor processing may begin at this stage. For example, transistors may be formed over each tub region by forming gate oxides and polysilicon layers. The polysilicon and gate oxides may be patterned to form gates and subsequently source and drain regions may be formed. (Usually n-channel transistors are formed over the p-tub and vice-versa.) Then, a dielectric may be formed covering the gate and source regions; windows may be opened to the dielectric and conductors deposited therein. (The process may also be utilized if desired to form an n-tub first and then a p-tub.) Should the designer desire, the process may also be utilized with bipolar technology and one or more bipolar transistors may be formed in each tub.

We claim:

1. A method of semiconductor integrated circuit formation comprising:

forming first and second tubs of first and second conductivity type in first and second portions of a substrate by directing a first conductivity-type dopant species normally at a first portion of said substrate;

forming a material layer over said first portion of said substrate;

directing a second conductivity-type dopant species at an angle away from normal at a second portion of said substrate; said material layer absorbing said second-type dopant and whereby a first conductivity-type tub is formed in said first portion of said substrate and a second conductivity-type tub is formed in said second portion of said substrate;

forming at least one transistor in said first tub and one transistor in said second tub.

2. The method of claim 1 in which said first conductivity type is p-type.

3. The method of claim 1 in which said second conductivity-type is n-type.

4. The method of claim 1 in which said material layer is silicon dioxide.

5. The method of claim 1 in which said transistors are MOS transistors.

6. A method of semiconductor integrated circuit formation comprising:

forming a first silicon dioxide layer having a thickness less than 100 Å upon a silicon substrate;

forming a silicon nitride layer upon said silicon dioxide layer;

forming a patterned photoresist upon said silicon nitride layer; said patterned photoresist overlying a second portion of said silicon substrate and not overlying a first portion of said silicon substrate;

patterning said silicon dioxide layer, thereby exposing said first portion of said substrate;

directing a p-type dopant species normally at said substrate, said p-type dopant species embedding itself in said first portion of said substrate and being absorbed by said patterned photoresist or said silicon nitride layer overlying said second portion of said substrate;

removing said photoresist; removing said silicon nitride layer;

exposing said substrate to an oxidizing environment, thereby forming a second silicon dioxide layer having a thickness of less than 600 Å overlying said first portion of said substrate;

directing an n-type dopant species at an angle away from normal at said substrate, said n-type dopant species embedding itself in said second portion of said substrate and being absorbed by said second silicon dioxide layer;

removing said first and second silicon dioxide layers, thereby exposing the surface of said silicon substrate, forming at least one n-channel transistor upon said first portion of said substrate and at least one p-channel transistor upon said second portion of said substrate.

* * * * *